(12) United States Patent
Ikami

(10) Patent No.: US 8,710,417 B2
(45) Date of Patent: Apr. 29, 2014

(54) STABLE LIGHT SOURCE DEVICE

(75) Inventor: Seishi Ikami, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 138 days.

(21) Appl. No.: 13/410,962

(22) Filed: Mar. 2, 2012

(65) Prior Publication Data

US 2012/0248989 A1 Oct. 4, 2012

(30) Foreign Application Priority Data

Mar. 30, 2011 (JP) ................................. 2011-076618

(51) Int. Cl.
*G01J 1/32* (2006.01)
*G01J 1/58* (2006.01)
*G01N 21/64* (2006.01)
*G01T 1/00* (2006.01)

(52) U.S. Cl.
USPC ........... 250/205; 250/483.1; 362/84; 315/151

(58) Field of Classification Search
USPC ......... 315/151; 362/231–235; 250/201.1–205
See application file for complete search history.

(56) References Cited

U.S. PATENT DOCUMENTS

| | | | |
|---|---|---|---|
| 6,335,997 | B1 | 1/2002 | Lee et al. |
| 2002/0122314 | A1 | 9/2002 | Kojima et al. |
| 2004/0232812 | A1 | 11/2004 | Beeson et al. |
| 2004/0233655 | A1 | 11/2004 | Zimmerman et al. |
| 2004/0233664 | A1 | 11/2004 | Beeson et al. |
| 2005/0064583 | A1* | 3/2005 | Caruso et al. ............... 435/287.2 |
| 2006/0203468 | A1 | 9/2006 | Beeson et al. |
| 2012/0099308 | A1* | 4/2012 | Brukilacchio ................ 362/235 |
| 2013/0258689 | A1* | 10/2013 | Takahira et al. ............. 362/465 |
| 2013/0294064 | A1* | 11/2013 | McCaughan et al. ......... 362/231 |

FOREIGN PATENT DOCUMENTS

| | | |
|---|---|---|
| JP | 3-262931 A | 11/1991 |
| JP | 2002-243544 A | 8/2002 |
| JP | 2004-361148 A | 12/2004 |
| JP | 2006-133147 A | 5/2006 |
| JP | 2007-531302 A | 11/2007 |
| JP | 2009-14379 A | 1/2009 |
| JP | 2009-287976 A | 12/2009 |
| JP | 2011-22553 A | 2/2011 |

OTHER PUBLICATIONS

Japanese Office Action dated Apr. 2, 2013, issued in corresponding Japanese Patent Application No. 2011-076618 (partial English translation is provided).

* cited by examiner

*Primary Examiner* — Alexander H Taningco
*Assistant Examiner* — Dylan White
(74) *Attorney, Agent, or Firm* — Birch, Stewart, Kolasch & Birch, LLP

(57) ABSTRACT

A stable light source device is provided with a light source, a pinhole constricting optical flux emitted from the light source, a first integrating element inside which optical flux from the pinhole is multiply reflected, a light detection sensor monitoring a light amount, a control section controlling the light source on the basis of the light amount monitored by the light detection sensor and making the light amount consistent, an aperture formed in the first integrating element and emitting light outside the first integrating element, a diffusion-transmission member disposed at a light emission side of the aperture, a branching section disposed at a light emission side of the diffusion-transmission member and branching incident light towards plural light emission portions, and neutral density filters provided at the light emission portions, transmitted light amounts thereof respectively differing such that light amounts at the light emission portions are respectively different.

8 Claims, 6 Drawing Sheets

STABLE LIGHT SOURCE DEVICE

CROSS-REFERENCE TO RELATED APPLICATION

This application claims priority under 35 USC 119 from Japanese Patent Application No. 2011-076618, filed Mar. 30, 2011, the disclosure of which is incorporated by reference herein.

BACKGROUND

1. Technical Field

The present invention relates to a stable light source device that is used in checking and correcting sensitivity, locality and the like of a light detector, particularly an area sensor, for measuring faint light that is not visible to the naked eye such as bioluminescence, chemoluminescence or the like.

2. Related Art

A stable light source device that is used in checking and correcting sensitivity, locality and the like of a light detector, particularly an area sensor, for measuring faint light that is not visible to the naked eye, such as bioluminescence, chemoluminescence or the like, is disposed in an imaging region of an area sensor, and faint light emitted from the stable light source device is detected by the light detector.

For example, the light source devices disclosed in Japanese Patent Application Laid-Open (JP-A) Nos. 2009-287976 and 3-262931 are known as this kind of stable light source device.

In a device according to JP-A No. 2009-287976 or JP-A No. 3-262931, there is a single light emission portion that emits light. Therefore, to measure the dynamic range of a light detector, it is necessary to vary a light emission amount of the light source and perform imaging a plural number of times, and operation is complicated. Moreover, although the light emission amount may be electronically varied to some extent, if light emission amounts are very different, it is difficult to provide consistent faint light amounts.

SUMMARY

The present invention has been made to solve the problem described above, and the present invention provides a stable light source device that is provided with plural light emission portions differing in light amounts and that is capable of providing consistent faint light amounts.

A stable light source device according to a first aspect of the present invention includes: a light source that emits light; a pinhole that constricts optical flux emitted from the light source; a first integrating element inside which optical flux from the pinhole is multiply reflected; a light detection sensor that monitors a light amount; a control section that controls the light source on the basis of the light amount monitored by the light detection sensor and that makes the light amount to be consistent; an aperture that is formed in the first integrating element and that emits light outside the first integrating element; a diffusion-transmission member that is disposed at a light emission side of the aperture; a branching section that is disposed at a light emission side of the diffusion-transmission member, and that branches incident light towards a plurality of light emission portions; and neutral density filters that are provided at the plurality of light emission portions, transmitted light amounts of the neutral density filters respectively differing such that light amounts at the light emission portions are respectively different.

The optical flux emitted from the light source is constricted by the pinhole and emitted to the first integrating element.

The incident light that is incident in the first integrating element is multiply reflected inside the first integrating element and spatially integrated. As a result, an intensity distribution of light in the first integrating element is uniform.

The light integrated inside the first integrating element is emitted through the aperture provided at the first integrating element, and the optical flux is further constricted by the aperture. The optical flux is then diffused uniformly in the diffusion-transmission member, and is incident on the branching section.

The light that has been uniformly diffused by the diffusion-transmission member is branched towards the plural light emission portions at the branching section.

Because the optical flux emitted from the light source reaches the light emission portions after being constricted in multiple stages by the pinhole and the aperture, light intensity that are emitted from the light emission portions are very small relative to a light amount of the light source.

The neutral density filters are provided at the light emission portions such that the transmitted light amounts (optical densities) at the respective light emission portions are respectively different. The control section controls the light source in accordance with light amounts from the light source, which are monitored by the light detection sensor, and makes the light amount consistent.

Therefore, the stable light source device of the first aspect of the invention may emit respectively different, consistent light amounts from the plural light emission portions.

A stable light source device according to a second aspect of the present invention is the first aspect of the invention in which the branching section is a second integrating element inside which incident optical flux is multiply reflected.

In the stable light source device of the second aspect of the invention, because the branching section is the second integrating element, the light incident on the branching section is multiply reflected inside the second integrating element and spatially integrated. As a result, the intensity distribution of light in the second integrating element is uniform. Hence, the light is branched towards the light emission portions.

By the light being branched with the simple structure of the second integrating element, light amount distributions of the lights transmitted through the light emission portions may be made uniform.

A stable light source device according to a third aspect of the present invention is the first aspect of the invention in which the neutral density filters with different attenuation amounts are provided such that the light amounts of the plural light emission portions differ in magnitude steps of approximately 1:10.

In the stable light source device of the third aspect of the invention, because the neutral density filters with different attenuation amounts are provided such that the light amounts of the plural light emission portions differ in magnitude steps of approximately 1:10, the light emission portions emit lights whose light amounts differ in magnitude steps of approximately 1:10 and a dynamic range of emitted light amounts may be made large.

To fabricate the light emission portions such that the light amounts differ in magnitude steps of close to 1:10, a large number of different neutral density filters are prepared and the light emission portions are adjusted therewith.

A stable light source device according to a fourth aspect of the present invention is the first aspect of the invention in which diameters of the light emission portions are set to at most 7 mm.

With the stable light source device of the fourth aspect of the invention, when a microtiter plate to be used in a biochemical analysis apparatus has a size of 13 cm×9 cm and is a 96-well plate, wells with diameter 7 mm are arrayed in 12 rows by 8 columns. In the biochemical analysis apparatus, this microtiter plate fits into a single image by an imaging apparatus.

When the stable light source device is to be used to check the sensitivity and the like of the imaging apparatus of the biochemical analysis apparatus, the stable light source device is disposed at a location at which the microtiter plate is disposed, instead of the microtiter plate. Therefore, it is preferable if the size of the stable light source device is equivalent to or smaller than that of the microtiter plate.

Although the respective light amounts of the plural light emission portions are different, if a light emission portion with a large light amount and a light emission portion with a small light amount are too close together, the light emission portion with the small light amount may be affected by light from the light emission portion with the large light amount, and it may not be possible to distinguish the light emission portion with the small light amount. Thus, a certain amount of spacing between the light emission portions is required.

The light emission portions must be plurally provided. Therefore, to provide plural light emission portions in a limited amount of space while assuring sufficient spacings between the light emission portions, it is preferable if the diameters of the light emission portions are not more than 7 mm.

When the branching section is a second integrating element, plural apertures are formed in the second integrating element and these apertures serve as the light emission portions. However, in regard to properties of the second integrating element, if the area of the apertures is excessively large, the incident light may not be uniformly diffused and reflected inside the second integrating element, and lights with uniform intensity distributions may not be provided. Therefore, with a view to uniformity when the branching section is a second integrating element, it is preferable if the diameters of the light emission portions are not too large, and it is preferable if they are not more than 7 mm.

Consequently, this stable light source device is excellent for checking the sensitivity and the like of an imaging apparatus of a biochemical analysis apparatus that uses microtiter plates, which have a range of uses in biochemical analysis apparatuses.

A minimum value of the diameters of the light emission portions is not particularly limited. However, in a stable light source device that is to be used for checking a biochemical analysis apparatus that uses microtiter plates, a lower limit of the diameters of the light emission portions will be around 3 mm in practice. The diameters of the light emission portions can be set to less than 3 mm but, if they are too small, light emission portions with small light emission amounts will, for example, be confused with image noise or the like and be hard to distinguish.

A stable light source device according to a fifth aspect of the present invention is the first aspect of the invention in which a light amount of the light source is adjusted by switching by a light amount switching switch.

In the stable light source device of the fifth aspect of the invention, the light amounts at the light emission windows may be adjusted by the light source being switched by the light amount switching switch (for example, being switched to a half). Thus, the dynamic range may be further increased.

A stable light source device according to a sixth aspect of the present invention is the first aspect of the invention in which the neutral density filters with different attenuation amounts are provided such that the light amounts of the plurality of light emission portions differ in magnitude steps of approximately 1:2.

In the stable light source device of the sixth aspect of the invention, because the neutral density filters with different attenuation amounts are provided such that the light amounts of the plural light emission portions differ in magnitude steps of approximately 1:2, the light emission portions emit lights whose light amounts differ in magnitude steps of approximately 1:2, and the dynamic range of emitted light amounts may be made large.

A stable light source device according to a seventh aspect of the present invention is the first aspect of the invention in which the neutral density filters with different attenuation amounts are provided such that the light amounts of the plurality of light emission portions differ in magnitude steps of approximately 1:3.

In the stable light source device of the seventh aspect of the invention, because the neutral density filters with different attenuation amounts are provided such that the light amounts of the plural light emission portions differ in magnitude steps of approximately 1:3, the light emission portions emit lights whose light amounts differ in magnitude steps of approximately 1:3, and the dynamic range of emitted light amounts may be made large.

A stable light source device according to an eighth aspect of the present invention is plurally provided with the stable light source device according to the first aspect of the invention, the plural stable light source devices being integrally structured in parallel, and the light sources of the stable light source devices emitting lights of different colors.

In the stable light source device of the eighth aspect of the invention, the plural light sources with different colors may be used, and any one may emit light selectively or the lights may be emitted simultaneously.

BRIEF DESCRIPTION OF THE DRAWINGS

Exemplary embodiments of the present invention will be described in detail based on the following figures, wherein.

DETAILED DESCRIPTION

Figure 1:
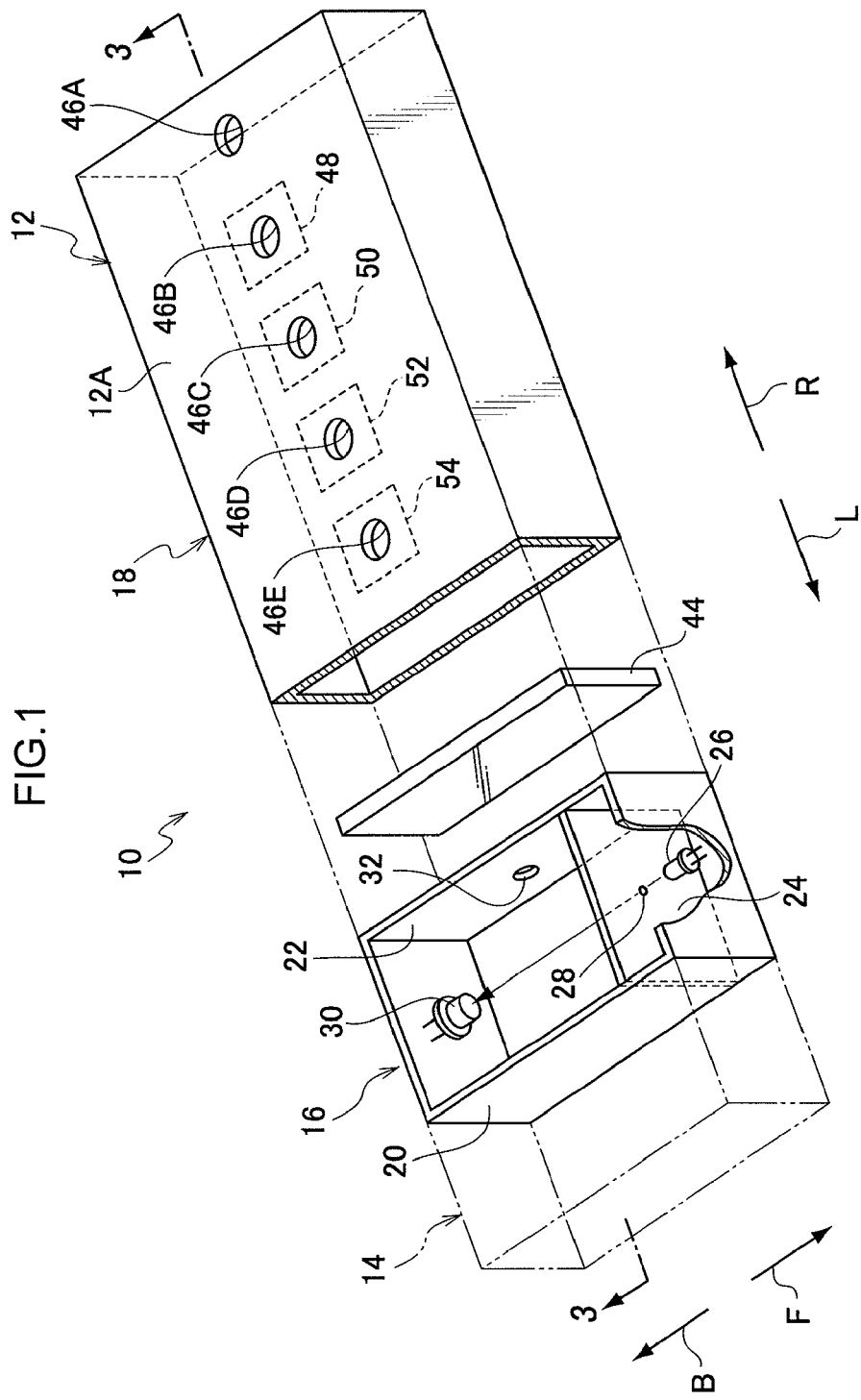
FIG. 1 is an exploded perspective diagram of a stable light source device relating to a first exemplary embodiment.
Figure 2:
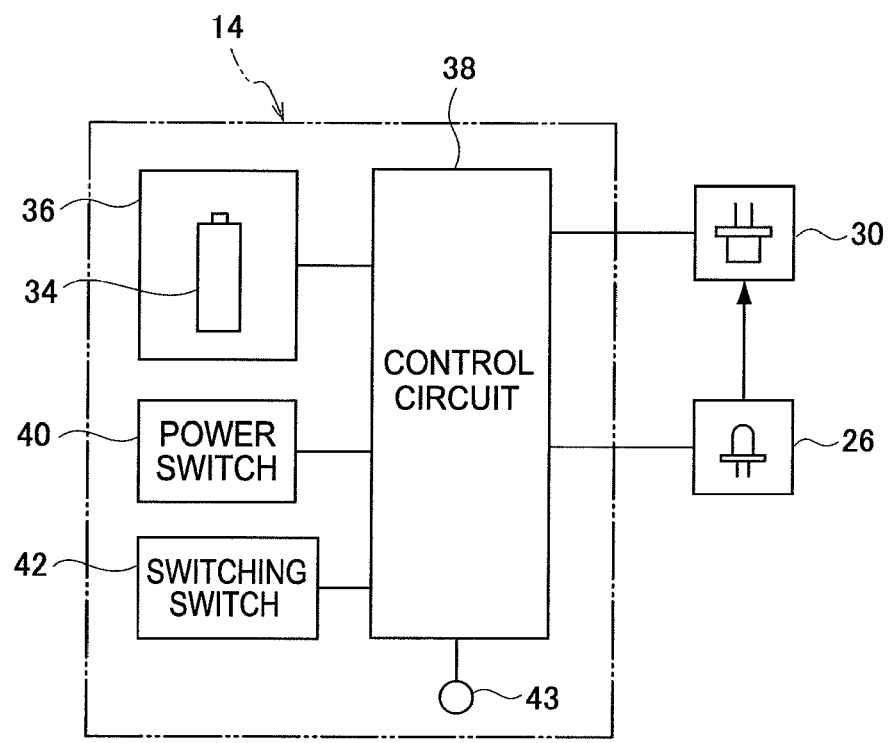
FIG. 2 is a block diagram of an electrical system of the stable light source device relating to the first exemplary embodiment.
Figure 3:
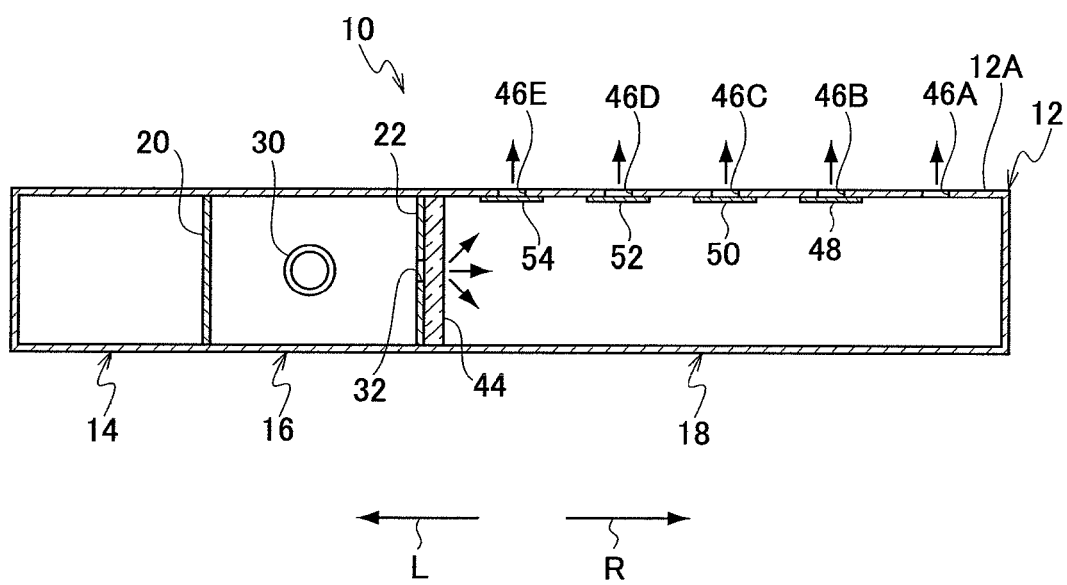
FIG. 3 is a sectional diagram taken along line 3-3 of the stable light source device illustrated in FIG. 1.

A stable light source device 10 relating to an exemplary embodiment of the present invention is described in accordance with FIG. 1 to FIG. 3.

As illustrated in FIG. 1 to FIG. 3, the stable light source device 10 of the present exemplary embodiment is provided with a black box 12, which is a sealed cuboid body. The interior of the black box 12 is divided, in the longitudinal direction, into three regions: a power source control section 14, a light source section 16 and a branching light emission section 18.

The interior of the black box 12 is partitioned in the longitudinal direction by a first dividing wall 20 and a second dividing wall 22. The side of the first dividing wall 20 in the direction of arrow L serves as the power source control section 14, the space between the first dividing wall 20 and the second dividing wall 22 serves as the light source section 16, and the side of the second dividing wall 22 in the direction of arrow R serves as the branching light emission section 18.

—Light Source Section—

A pinhole plate 24 is provided in the light source section 16 at one width direction side thereof (the side in the direction of arrow F in the drawings). An LED 26, which is a solid state light-emitting device that serves as a light source, is disposed at the arrow F direction side of the pinhole plate 24. In the stable light source device 10 of the present exemplary embodiment, the LED 26 that is used is a bullet-type LED that emits green light (for example, wavelength 530 nm), though obviously a surface-mounted type of LED may be used.

The LED 26 is used as the light source in the present exemplary embodiment. However, for example, a laser diode (LD) or the like may be used as the light source, provided consistent light may be emitted.

A pinhole 28 for light extinction is formed at the middle of the pinhole plate 24. A central axis of the pinhole 28 coincides with an optical axis of the LED 26, and the pinhole 28 is disposed on a direction of emission of light from the LED 26.

The diameter of the pinhole 28 is, as a preferable example, in a range from 0.1 mm to 0.7 mm. However, the diameter of the pinhole 28 is not limited to a particular range for the present invention.

At the light source section 16, a light detection sensor 30, which is a solid state light-receiving device such as a photo-diode (PD) or the like, is disposed at the opposite side of the pinhole plate 24 from the side at which the LED 26 is disposed, so as to oppose the pinhole 28 and the LED 26. Optical flux emitted from the LED 26 is constricted (extinguished) by the pinhole 28 and reaches the light detection sensor 30. That is, in the present exemplary embodiment the light detection sensor 30 is disposed on the optical axis of the LED 26.

The inner walls of the light source section 16 are coated with a coating that is high in reflectivity and excellent in diffusiveness, for example, a matted white coating, similarly to an integrating sphere. The light from the LED 26 that enters the light source section 16 through the pinhole 28 is repeatedly diffusively reflected by the inner walls and spatially integrated, and forms a uniform light intensity distribution at the inner walls.

An emission port 32 that functions as an aperture is formed at the middle of the second dividing wall 22. The emission port 32 of the present exemplary embodiment is specified with a diameter of 3 mm, but the diameter of the emission port 32 is not limited to 3 mm for the present invention.

—Light Source Control Section—

As illustrated in FIG. 2, the power source control section 14 is provided with a battery box 36 holding a battery 34, a control circuit 38, a power supply switch 40, a light amount switching switch 42, and an indicator 43.

The battery 34 has the function of supplying electrical power to the LED 26 and the control circuit 38. When the power supply switch 40 is turned on, the battery 34 supplies power to the LED 26, the control circuit 38 and the indicator 43. The indicator 43 lights up for several seconds after the power supply switch 40 is turned on, and then automatically turns off provided the voltage of the battery 34 is within a prescribed range. If the voltage is out of the prescribed range, the indicator 43 does not turn on in the first place or stays turned on to give notice of the problem.

The above-mentioned LED 26 and light detection sensor 30 are connected to the control circuit 38. The control circuit 38 has the function of controlling current flowing to the LED 26 in accordance with light amounts monitored by the light detection sensor 30 and making the light amounts consistent (i.e., feedback control). Herein, the light detection sensor 30 directly receives light emitted from the LED 26.

The light amount switching switch 42 is connected to the control circuit 38. The light amount from the LED 26 may be set to, for example, half (50%) by switching of the light amount switching switch 42.

—Branching Light Emission Section—

As illustrated in FIG. 1 and FIG. 3, a diffusion-transmission member 44 that is formed of, for example, a milky-white semi-transparent synthetic resin plate, white opal glass or the like is applied to an inner wall of the branching light emission section 18 at the light source section side thereof.

The diffusion-transmission member 44 uniformly diffuses the light emitted through the emission port 32 toward the interior of the branching light emission section.

The light source section side inner walls of the branching light emission section 18 (apart from a region to which the diffusion-transmission member 44 is applied) are coated with a coating that is high in reflectivity and excellent in diffusiveness, for example, a matted white coating, similarly to an integrating sphere. Thus, the light diffused by the diffusion-transmission member 44 is repeatedly diffusively reflected by the inner walls and spatially integrated, and forms a uniform light intensity distribution at the inner walls.

A plural number (five in the present exemplary embodiment) of light emission windows 46A, 46B, 46C, 46D and 46E that serve as light emission portions are formed in an upper wall 12A of the branching light emission section 18.

The light emission windows 46A, 46B, 46C, 46D and 46E of the present exemplary embodiment are all circles with the same diameter. The diameter of each light emission window in the present exemplary embodiment is 7 mm. However, the diameters of the light emission windows 46A, 46B, 46C, 46D and 46E are not limited to 7 mm for the present invention. Furthermore, although the shapes of the light emission windows in the present exemplary embodiment are circles, other shapes such as rectangles and the like may be used.

The sizes of the light emission windows of the stable light source device 10 of the present exemplary embodiment are specified with the assumption that the stable light source device 10 is to be used for checking an imaging apparatus (a light detector) of a biochemical analysis apparatus, which has a range of uses in the field of biochemistry. If the stable light source device 10 is to be used for checking of a light detector of a biochemical analysis apparatus, it is preferable if the sizes of the light emission windows are 3 mm to 7 mm, but the sizes are not limited to these diameters.

In an imaging area of the imaging apparatus of a biochemical analysis apparatus that uses the aforementioned microtiter plate (13 cm×9 cm), a proportion of the imaging area that is taken up by an aperture area with a diameter of 3 to 7 mm is 0.06 to 0.33%. If, for example, a microscope slide glass (76 mm×26 mm) is used as a support plate, when a spot with a diameter of 30 µm on the support plate is imaged, a proportion of the imaging region (76 mm×26 mm) that is taken up by the area of the spot is 0.007%, while if the size of the spot is 10 μm, the proportion of the imaging region (76 mm×26 mm) that is taken up by the area of the spot is 0.003%.

However, a preferable range of the proportion of an imaging region that is taken up by the area of each light emission window 46 is not necessarily determined as a number of square millimeters or a percentage, but is appropriately varied in accordance with an object of checking or the like.

In the branching light emission section 18 of the present exemplary embodiment, the light emission window 46A at the side of the direction of arrow R in the drawing is a simple transparent hole. A first neutral density filter (ND filter) 48 is provided at the light emission window 46B at the arrow L direction side of the light emission window 46A. A second neutral density filter 50 is provided at the light emission window 46C at the arrow L direction side of the light emission window 46B, a third neutral density filter 52 is provided at the light emission window 46D at the arrow L direction side of the light emission window 46C, and a fourth neutral density filter 54 is provided at the light emission window 46E at the arrow L direction side of the light emission window 46D.

The first neutral density filter 48, the second neutral density filter 50, the third neutral density filter 52 and the fourth neutral density filter 54 are each fixed to an inner face of the upper wall 12A of the branching light emission section 18. Thus, upper faces of the first neutral density filter 48, the second neutral density filter 50, the third neutral density filter 52 and the fourth neutral density filter 54 are disposed at positions that are lower than the upper face (surface) of the upper wall 12A by an amount corresponding to a plate thickness of the upper wall 12A.

The first neutral density filter 48, the second neutral density filter 50, the third neutral density filter 52 and the fourth neutral density filter 54 are specified such that transmitted amounts of light (filter transmission amounts) thereof differ in magnitude steps of approximately 1:10. An attenuation amount (transmission amount) of the first neutral density filter 48 is set such that the transmission amount thereof is $\frac{1}{10}$ of a transmission amount of the light emission window 46A, an attenuation amount (transmission amount) of the second neutral density filter 50 is set such that the transmission amount thereof is $\frac{1}{100}$ of the transmission amount of the light emission window 46A, an attenuation amount (transmission amount) of the third neutral density filter 52 is set such that the transmission amount thereof is $\frac{1}{1000}$ of the transmission amount of the light emission window 46A and an attenuation amount (transmission amount) of the fourth neutral density filter 54 is set such that the transmission amount thereof is $\frac{1}{10000}$ of the transmission amount of the light emission window 46A (if optical density is expressed by D and transmittance is expressed by T, the equation $D=\log(1/T)$ is satisfied).

In the present exemplary embodiment, as an example, neutral density filters may be used for the first neutral density filter 48 to fourth neutral density filter 54. However, other kinds of filter may be used provided they can attenuate the light amounts.

—Operation—

Next, operation of the stable light source device 10 of the present exemplary embodiment is described.

When the stable light source device 10 is to be used for, as an example, checking and adjustment or the like of an imaging apparatus of a biochemical analysis apparatus, the stable light source device 10 is disposed in an imaging region of the imaging apparatus, and the upper wall 12A in which the light emission windows are formed is caused to oppose a front face of the imaging apparatus (on the optical axis of an imaging lens).

When the power supply switch 40 of the stable light source device 10 is turned on, the LED 26 emits light, the optical flux emitted from the LED 26 is constricted (extinguished) by the pinhole 28, and a portion of the light is directly received by the light detection sensor 30. The control circuit 38 controls the current flowing to the LED 26 in accordance with light amounts monitored by the light detection sensor 30, and keeps the light amount constant. Hence, consistent light with no light amount variations may be emitted from the light emission windows.

The light emitted through the pinhole 28 is repeatedly diffusely reflected by the inner walls of the light source section 16 and is spatially integrated. Thus, the light forms a uniform light intensity distribution at the inner walls of the light source section 16.

A portion of the light that has been diffusively reflected by the inner walls of the light source section 16 is emitted through the emission port 32 formed at the middle of the second dividing wall 22, is then uniformly diffused toward the branching light emission section 18 by the diffusion-transmission member 44, is repeatedly diffusively reflected by the inner walls of the branching light emission section 18 and spatially integrated, and forms a uniform light intensity distribution at the inner walls of the branching light emission section 18.

Because the first neutral density filter 48, second neutral density filter 50, third neutral density filter 52 and fourth neutral density filter 54 are applied to the inner sides of the light emission window 46B, light emission window 46C, light emission window 46D and light emission window 46E formed in the upper wall 12A of the branching light emission section 18, the light amount of light emitted through the light emission window 46B is $\frac{1}{10}$ of the light amount of light emitted from the light emission window 46A, the light amount of light emitted from the light emission window 46C is $\frac{1}{100}$ of the same, the light amount of light emitted from the light emission window 46D is $\frac{1}{1000}$, and the light amount of light emitted from the light emission window 46E is $\frac{1}{10000}$.

Thus, consistently extinguished lights may be emitted from the respective light emission windows.

In the stable light source device 10 of the present exemplary embodiment, lights with different light amounts are emitted from the light emission windows. Therefore, the dynamic range of an imaging apparatus may be checked by detecting the lights emitted from the light emission windows.

In the stable light source device 10 of the present exemplary embodiment, the light amount at each light emission window may be halved by switching of the light amount switching switch 42, and the dynamic range may be further widened.

In the branching light emission section 18, the incident light is repeatedly diffusively reflected by the inner walls and spatially integrated. Therefore, for example, a light emission profile as illustrated in FIG. 4B is formed at each light emission window, and an intensity distribution is substantially equal between a central region and outer periphery regions of the light emission window (in FIG. 4B, the reference numeral 46 indicates the light emission window and the vertical axis represents light intensity).

Figure 4A:
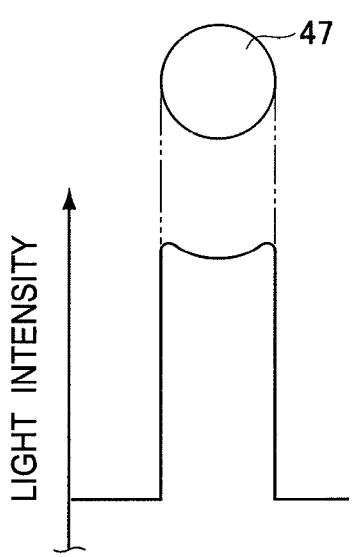
FIG. 4A is a light emission profile of a sample.
Figure 4B:
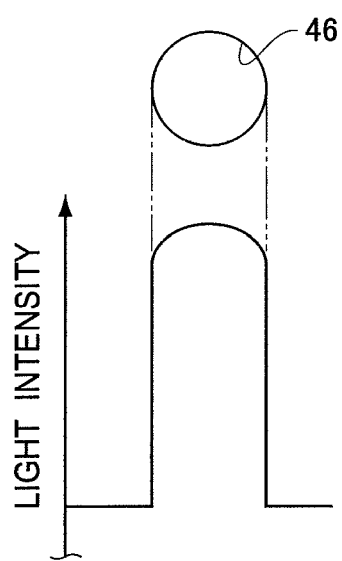
FIG. 4B is a light emission profile of a light emission window of the stable light source device.

A light emission profile of a sample that is disposed in a well of a microtiter plate and emits chemoluminescence or emits fluorescence has the form illustrated in FIG. 4A (in FIG. 4A, the reference numeral 47 indicates the sample and the vertical axis represents light intensity), which is substantially the same as the light emission profile of a light emission window of the stable light source device 10.

Figure 5A:
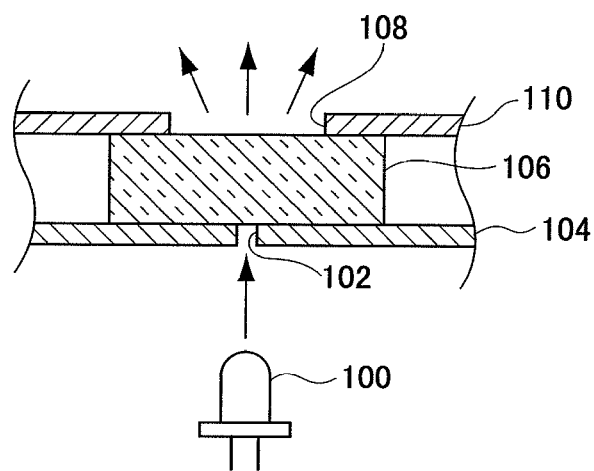
FIG. 5A is a sectional diagram illustrating principal portions of a stable light source device relating to a reference example.
Figure 5B:
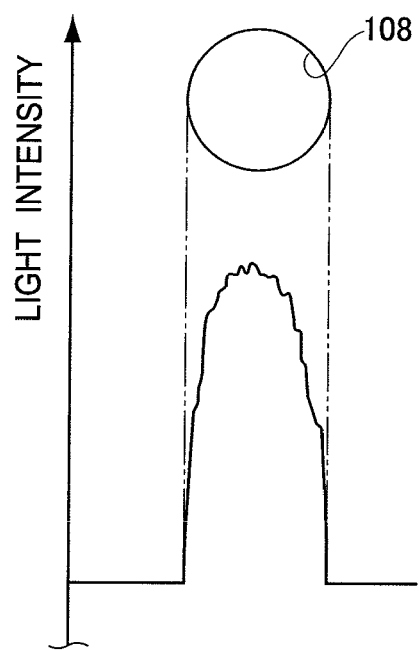
FIG. 5B is a light emission profile of a light emission window of the stable light source device relating to the reference example.

For reference, in a stable light emission device as illustrated in FIG. 5A, an LED 100, a pinhole plate 104 in which a pinhole 102 is formed, a diffusion-transmission member 106, and a wall member 110 in which a light emission window 108 is formed are arranged in this order. In this stable light emission device, the light emission window 108 has the intensity distribution illustrated in FIG. 5B, which is very different from the intensity distribution of light emission from the sample.

The light emission windows 46A, 46B, 46C, 46D and 46E of the stable light source device 10 of the present exemplary embodiment are circles with diameter 7 mm, being set to the same diameter as wells with 7 mm diameter in a microtiter plate that is used in a biochemical analysis apparatus.

Thus, the stable light source device 10 of the present exemplary embodiment, which provides an intensity distribution substantially the same as an intensity distribution of light emission from a sample, is suitable for checking, adjustment and the like of the biochemical analysis apparatus.

In the present exemplary embodiment, the upper faces of the first neutral density filter 48, the second neutral density filter 50, the third neutral density filter 52 and the fourth neutral density filter 54 are at positions that are lower than the upper face (surface) of the upper wall 12A by the plate thickness of the upper wall 12A. Therefore, incidences of, for example, light leaking from the light emission window 46A toward the adjacent light emission window 46B or the like such that it cannot be distinguished whether or not light is being emitted from the light emission window 46B will not occur.

Figure 6A:
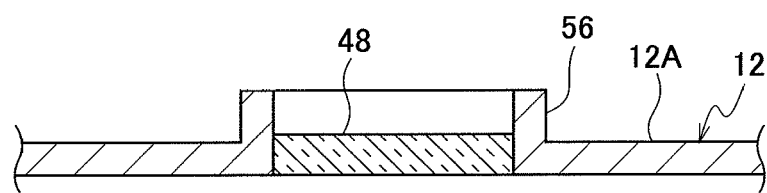
FIG. 6A is a sectional diagram of a light emission window of a stable light source device relating to another exemplary embodiment.
Figure 6B:
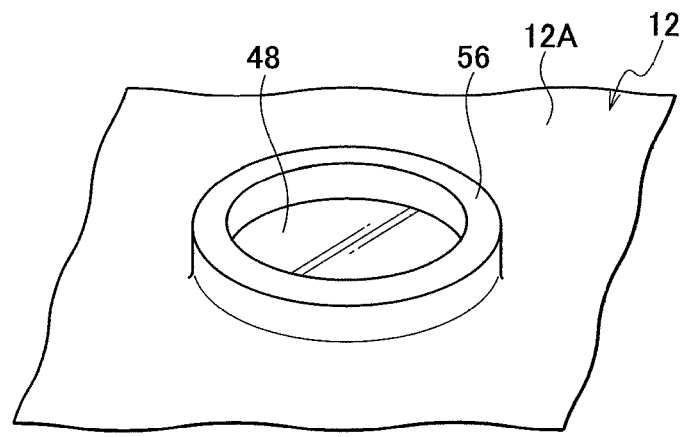
FIG. 6B is a perspective diagram of the light emission window illustrated in FIG. 6A.

In the stable light source device 10 of the present exemplary embodiment, the first neutral density filter 48 to fourth neutral density filter 54 are fixed to the inner face of the upper wall 12A of the branching light emission section 18, and the upper faces of the first neutral density filter 48 to fourth neutral density filter 54 are at positions that are lower than the upper face (surface) of the upper wall 12A by the plate thickness of the upper wall 12A. However, for example, as illustrated in FIG. 6A and FIG. 6B, the first neutral density filter 48 may be disposed within the light emission window, with the upper face of the first neutral density filter 48 at a position the same as the upper face (surface) of the upper wall 12A. In this case, it is preferable if an annular protrusion 56 is formed on the top face of the upper wall 12A around the periphery of the light emission window so as not to affect another light emission window with a smaller light emission amount. In any case, it is preferable if the surroundings of the first neutral density filter 48 to fourth neutral density filter 54 are higher than the upper faces of the first neutral density filter 48 to fourth neutral density filter 54.

—Second Exemplary Embodiment—

Figure 7:
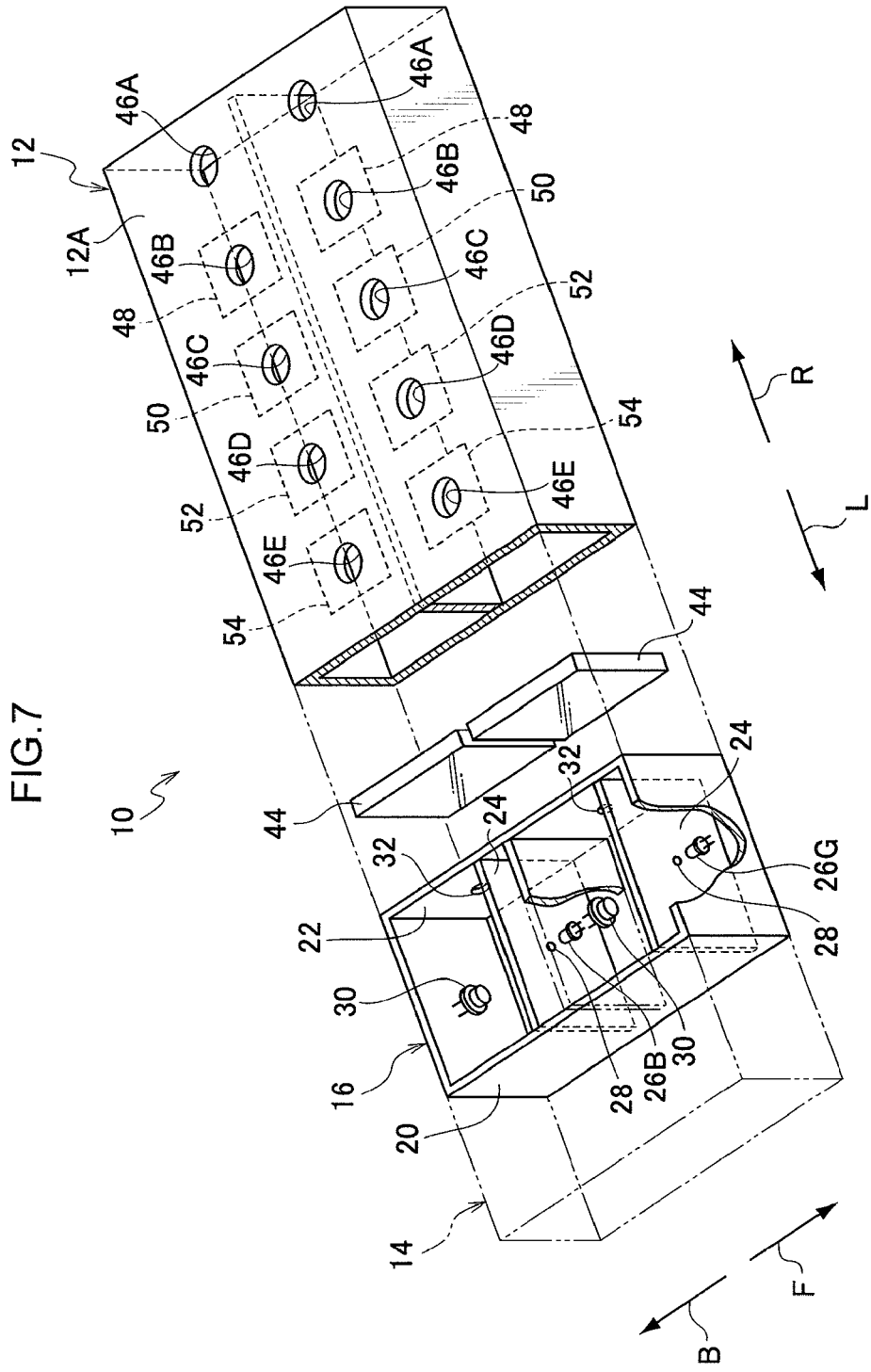
FIG. 7 is an exploded perspective diagram of a stable light source device relating to a second exemplary embodiment.

Next, a second exemplary embodiment of the stable light source device of the present invention is described in accordance with FIG. 7. Structures that are the same as in the first exemplary embodiment are assigned the same reference numerals and are not described.

As illustrated in FIG. 7, the stable light source device 10 of the present exemplary embodiment has a structure in which two of the black box 12 described for the stable light source device 10 of the first exemplary embodiment are arranged in parallel and made integral. An LED 26B and an LED 26G are used. The LED 26B is provided in the black box 12 at the arrow B direction side and emits blue light (for example, with wavelength 470 nm), and the LED 26G is provided in the black box 12 at the arrow F direction side and emits green light (for example, with wavelength 530 nm).

Thus, if the stable light source device 10 of the present exemplary embodiment is used, green light emission and blue light emission may be provided alternatively or simultaneously.

—Other Embodiments—

In the stable light source device 10 of the above-described second exemplary embodiment, an example is described in which the LED 26G that emits green light and the LED 26B that emits blue light are used. However, the colors of lights emitted from light emission portions of the present invention are not limited to green and blue; LEDs that emit other colors such as red, white, violet and so forth may be used.

In the above exemplary embodiments, LEDs are used as light sources, but the present invention is not limited thus. Another solid state light emission element such as a laser diode (LD) or the like may be used, provided consistent light can be emitted, and a filament lamp may be used for a light source provided the light amount is consistent.

In the branching light emission section 18 of the above exemplary embodiments, light that is incident via the emission port 32 and the diffusion-transmission member 44 is integrated inside the branching light emission section 18, and the light branches towards the light emission windows. However, the present invention is not limited thus. For example, optical fibers may be disposed so as to join the emission port 32 with light emission window portions and the optical fibers used to branch the light to the light emission window portions.

In the stable light source device 10 of the above exemplary embodiments, the light detection sensor 30, the pinhole 28 and the LED 26 are disposed on a straight line, the light detection sensor 30 is disposed so as to oppose the LED 26, and the light detection sensor 30 directly receives a portion of the light emitted from the LED 26. However, a half-mirror (or a prism or the like) that is angled with respect to the pinhole plate 24 may be disposed between the pinhole plate 24 and the LED 26, and light from the LED 26 that is reflected by the half-mirror (or prism or the like) may be received by the light detection sensor 30. Accordingly, the light detection sensor 30 may be disposed close to the LED 26.

In the above exemplary embodiments, values of transmittance of the neutral density filters are set so as to differ in magnitude steps of approximately 1:10. However, depending on purposes, it is not strictly necessary for the transmittances to differ in magnitude steps of 1:10; the priority is for the light emission portions to emit lights that are consistent over time. In the present invention, transmittances of the neutral density filters may be suitably modified within a scope not departing from the spirit of the present invention. For example, the values of transmittance of the neutral density filters may be set to differ in magnitude steps of approximately 1:2, and may be set to differ in magnitude steps of approximately 1:3.

Furthermore, in the stable light source device 10 of the above exemplary embodiments, no neutral density filter is provided at the light emission window 46A, but the present invention is not limited thus and a neutral density filter may be provided at the light emission window 46A. Moreover, the light emission window 46A may usually be covered with a light-blocking lid so as not to emit light and so as not to interfere with light emission from light emission windows with fainter lights.

Further, the foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A stable light source device comprising:
   a light source that emits light;
   a pinhole that constricts optical flux emitted from the light source;
   a first integrating element inside which optical flux from the pinhole is multiply reflected;
   a light detection sensor that monitors a light amount;
   a control section that controls the light source on the basis of the light amount monitored by the light detection sensor and that makes the light amount to be consistent;
   an aperture that is formed in the first integrating element and that emits light outside the first integrating element;
   a diffusion-transmission member that is disposed at a light emission side of the aperture;
   a branching section that is disposed at a light emission side of the diffusion-transmission member, and that branches incident light towards a plurality of light emission portions; and
   neutral density filters that are provided at the plurality of light emission portions, transmitted light amounts of the neutral density filters respectively differing such that light amounts at the light emission portions are respectively different.

2. The stable light source device according to claim 1, wherein the branching section comprises a second integrating element inside which incident optical flux is multiply reflected.

3. The stable light source device according to claim 1, wherein the neutral density filters with different attenuation amounts are provided such that the light amounts of the plurality of light emission portions differ in magnitude steps of approximately 1:10.

4. The stable light source device according to claim 1, wherein diameters of the light emission portions are set to at most 7 mm.

5. The stable light source device according to claim 1, wherein a light amount of the light source is adjusted by switching by a light amount switching switch.

6. The stable light source device according to claim 1, wherein the neutral density filters with different attenuation amounts are provided such that the light amounts of the plurality of light emission portions differ in magnitude steps of approximately 1:2.

7. The stable light source device according to claim 1, wherein the neutral density filters with different attenuation amounts are provided such that the light amounts of the plurality of light emission portions differ in magnitude steps of approximately 1:3.

8. A stable light source device comprising a plurality of the stable light source device according to claim 1, the plurality of stable light source devices being integrally structured in parallel, and the light sources of the stable light source devices emitting lights of different colors.

* * * * *